(12) United States Patent
Tsao

(10) Patent No.: US 9,035,425 B2
(45) Date of Patent: May 19, 2015

(54) SEMICONDUCTOR INTEGRATED CIRCUIT

(71) Applicant: United Microelectronics Corp., Hsin-Chu (TW)

(72) Inventor: Po-Chao Tsao, New Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/875,291

(22) Filed: May 2, 2013

(65) Prior Publication Data
US 2014/0327074 A1   Nov. 6, 2014

(51) Int. Cl.
*H01L 29/00*  (2006.01)
*H01L 27/088*  (2006.01)
*H01L 27/06*  (2006.01)
*H01L 21/8234*  (2006.01)
*H01L 21/70*  (2006.01)

(52) U.S. Cl.
CPC ........ *H01L 27/0886* (2013.01); *H01L 27/0629* (2013.01); *H01L 21/823431* (2013.01)

(58) Field of Classification Search
CPC ............ H01L 27/0611; H01L 27/0629; H01L 27/0886; H01L 21/845; H01L 27/0203; H01L 27/1112; H01L 28/20; H01L 2924/14; H01L 27/0802
USPC ......... 257/499–501, 506, 510, 516, 528, 536, 257/368, 379, 74, 296, 288, E27.009, 257/E27.001, E25.01
See application file for complete search history.

(56) References Cited

U.S. PATENT DOCUMENTS

| | | | |
|---|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |

(Continued)

OTHER PUBLICATIONS

Hsu et al., Title: Transistor Device and Manufacturing Method Thereof, pending U.S. Appl. No. 13/525,471, filed Jun. 18, 2012.

*Primary Examiner* — Galina Yushina
(74) *Attorney, Agent, or Firm* — Winston Hsu; Scott Margo

(57) ABSTRACT

A semiconductor integrated circuit includes a substrate, a multi-gate transistor device formed on the substrate, and an n-well resistor formed in the substrate. The substrate includes a plurality of first isolation structures and at least a second isolation structure formed therein. A depth of the first isolation structures is smaller than a depth of the second isolation structure. The multi-gate transistor device includes a plurality of fin structures, and the fin structures are parallel with each other and spaced apart from each other by the first isolation structures. The n-well resistor includes at least one first isolation structure. The n-well resistor and the multi-gate transistor device are electrically isolated from each other by the second isolation structure.

7 Claims, 8 Drawing Sheets

(56) References Cited

U.S. PATENT DOCUMENTS

| | | |
|---|---|---|
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 7,944,000 B2 * | 5/2011 | Ohtsuka et al. ............... 257/375 |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0096255 A1 * | 5/2007 | Huang et al. ................. 257/536 |
| 2007/0132033 A1 | 6/2007 | Wu |
| 2007/0273001 A1 | 11/2007 | Chen |
| 2008/0030297 A1 * | 2/2008 | Ohtsuka et al. ........... 338/22 SD |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |
| 2011/0070712 A1 * | 3/2011 | Johnson et al. ................ 438/382 |
| 2011/0210402 A1 * | 9/2011 | Anderson et al. ............. 257/392 |
| 2012/0273882 A1 | 11/2012 | Ratnam |
| 2013/0045580 A1 * | 2/2013 | Cho .............................. 438/296 |
| 2013/0105942 A1 * | 5/2013 | Chen et al. .................... 257/532 |
| 2013/0241001 A1 * | 9/2013 | Chen et al. .................... 257/380 |

* cited by examiner

A-A'

SEMICONDUCTOR INTEGRATED CIRCUIT

BACKGROUND OF THE INVENTION

1. Field of the Invention

The present invention relates to a semiconductor integrated circuit, and more particularly, to a semiconductor integrated circuit having multi-gate transistor device integrated with other devices such as resistor and/or lateral double-diffused metal-oxide-semiconductor (hereinafter abbreviated as LDMOS) device.

2. Description of the Prior Art

Conventional planar metal-oxide-semiconductor (hereinafter abbreviated as MOS) transistor has difficulty when scaling down to 65 nm and below. Therefore the non-planar transistor technology such as Fin Field effect transistor (FinFET) technology that allows smaller size and higher performance is developed to replace the planar MOS transistor.

Since the manufacturing processes of the FinFET device are easily integrated into the traditional logic device processes, it provides superior process compatibility. More important, since the FinFET device increases the overlapping area between the gate and the substrate, the channel region is more effectively controlled. This therefore reduces drain-induced barrier lowering (DIBL) effect and short channel effect. In addition, the channel region is longer under the same gate length, and thus the current between the source and the drain is increased.

However, the FinFET device still faces many problems. For example, semiconductor structures of different sizes and isolation structures of different sizes are often formed on one semiconductor integrated circuit, and it is always difficult to construct and integrate those semiconductor structures and the isolation structures of different sizes on the same substrate. Furthermore, it is difficult for the circuit designer to construct above mentioned semiconductor integrated circuit without increasing process cost.

SUMMARY OF THE INVENTION

According to an aspect of the present invention, a semiconductor integrated circuit is provided. The semiconductor integrated circuit includes a substrate, a multi-gate transistor device positioned on the substrate, and an n-well resistor positioned in the substrate. The substrate includes a plurality of first isolation structures and at least one second isolation structure formed therein. A depth of the first isolation structures is smaller than a depth of the second isolation structure. The multi-gate transistor device includes a plurality of fin structures, and the fin structures are parallel with each other and spaced apart from each other by the first isolation structures. The n-well resistor includes at least one first isolation structure. The n-well resistor is electrically isolated from the multi-gate transistor device by the second isolation structure.

According to another aspect of the present invention, a semiconductor integrated circuit is provided. The semiconductor integrated circuit includes a substrate, a multi-gate transistor device positioned on the substrate, and an LDMOS device positioned on the substrate. The substrate includes a plurality of first isolation structures and at least one second isolation structure formed therein. A depth of the first isolation structures is smaller than a depth of the second isolation structure. The multi-gate transistor device includes a plurality of first fin structures and a first gate electrode formed on the substrate. The first fin structures are parallel with each other and spaced apart from each of by the first isolation structures. The first gate electrode is intersectionally arranged with the first fin structures, and covers a portion of each first fin structure. The LDMOS device includes a second gate electrode positioned on the substrate. The second gate electrode covers a portion of one first isolation structure. The LDMOS device is electrically isolated from the multi-gate transistor device by the second isolation structure.

According to still another aspect of the present invention, a semiconductor integrated circuit is provided. The semiconductor integrated circuit includes a substrate, a multi-gate transistor device positioned on the substrate, and an LDMOS device positioned on the substrate. The substrate includes a plurality of first isolation structures and a plurality of second isolation structures formed therein. A depth of the first isolation structures is smaller than a depth of the second isolation structures. The multi-gate transistor device includes a plurality of first fin structures and a first gate electrode positioned on the substrate. The first fin structures are parallel with each other and spaced apart from each other by the first isolation structures. The first gate electrode is intersectionally arranged with the first fin structures, and covers a portion of each first fin structure. The LDMOS device includes a second gate electrode positioned on the substrate. The second gate electrode covers a portion of one second isolation structure. The LDMOS device is electrically isolated from the multi-gate transistor device by another second isolation structure.

According to the semiconductor integrated circuit provided by the present invention, the multi-gate transistor device having the fin structures is integrated with the n-well resistor and/or the LDMOS device, which complies with high voltage requirement. Those different devices are electrically isolated by the first isolation structures and the second isolation structures of which the sizes are different. In other words, the semiconductor integrated circuit provided by the present invention renders superior flexibility to those circuit designers. In other words, the semiconductor integrated circuit having devices of different sized can be integrated without increasing process cost due to the flexibility rendered by the semiconductor integrated circuit of the present invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A-3B are schematic drawings illustrating a method for manufacturing isolation structures provided by a preferred embodiment of the present invention, wherein FIGS. 1B, 2B, and 3B are cross-sectional views taken along Line A-A' of FIGS. 1A, 2A, and 3A, respectively.

DETAILED DESCRIPTION

Figure 1A:
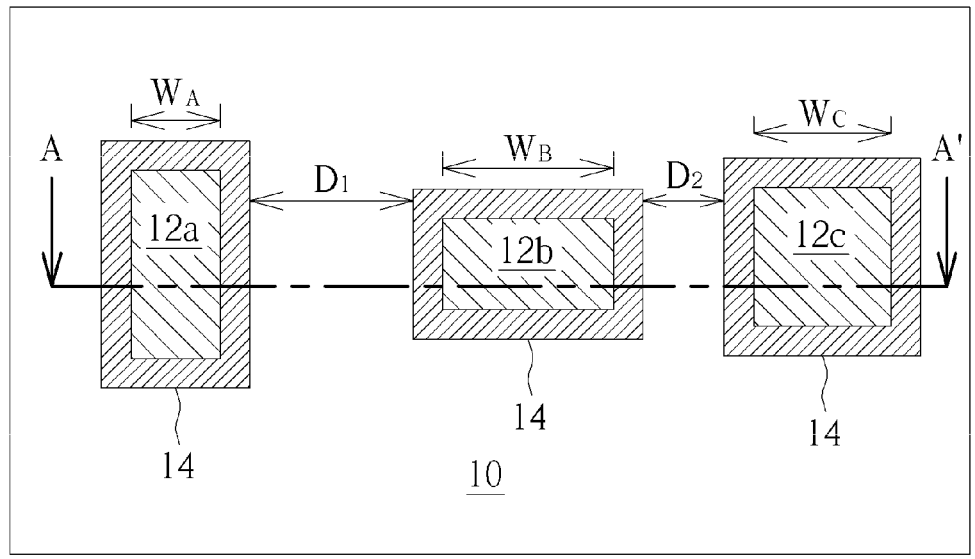
Figure 1B:
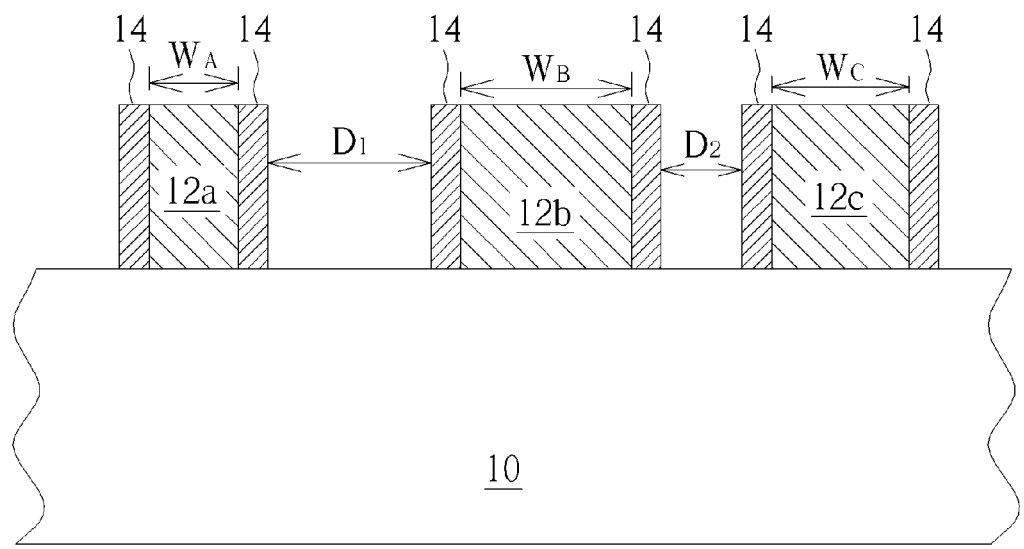
Figure 2A:
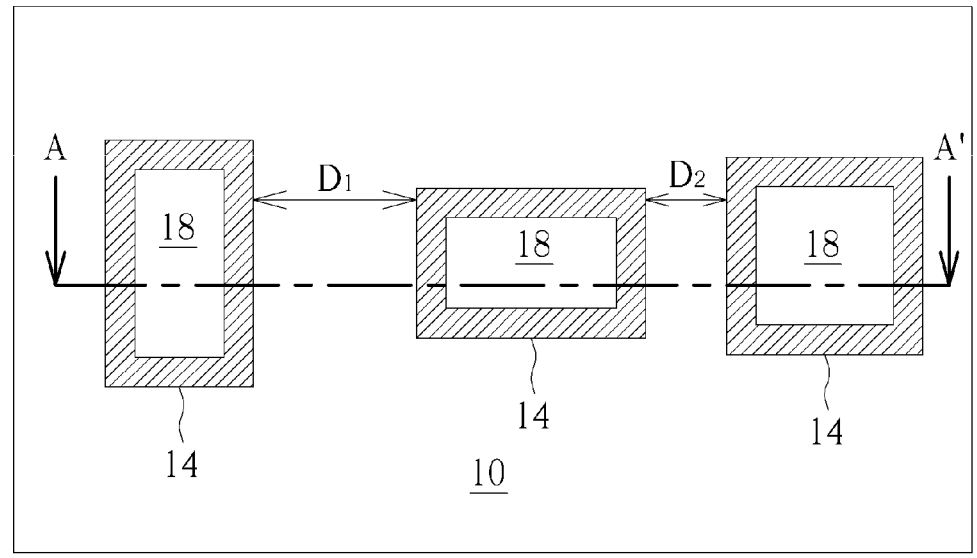
Figure 2B:
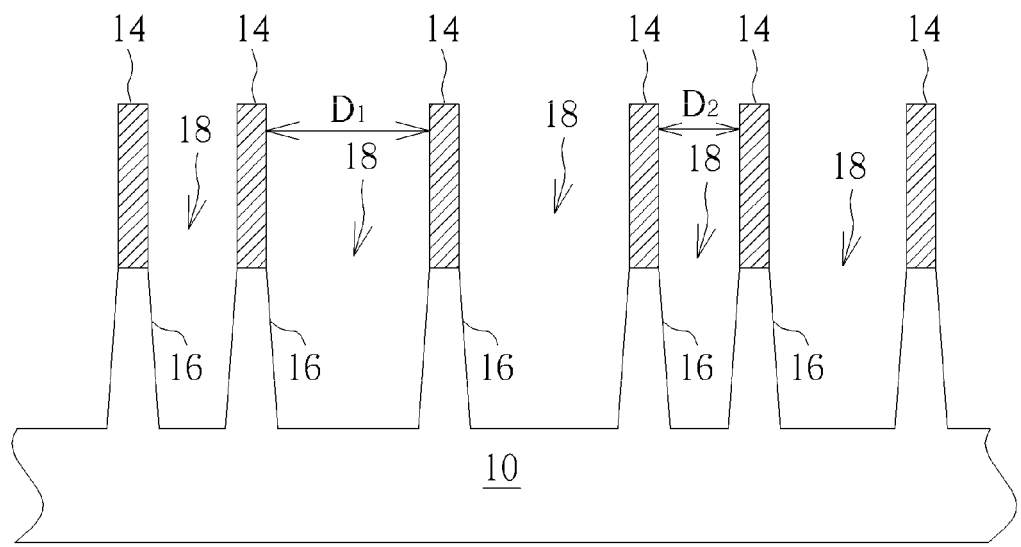
Figure 3A:
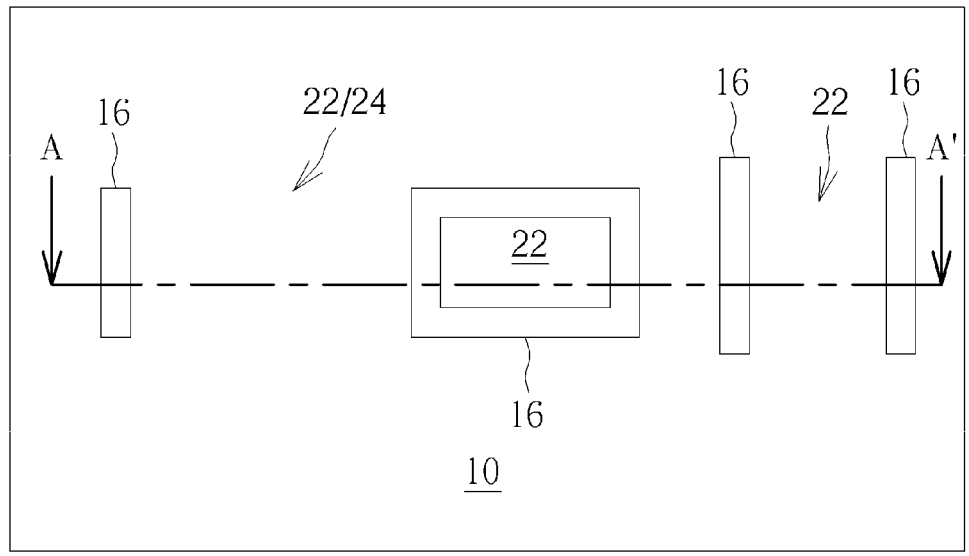
Figure 3B:
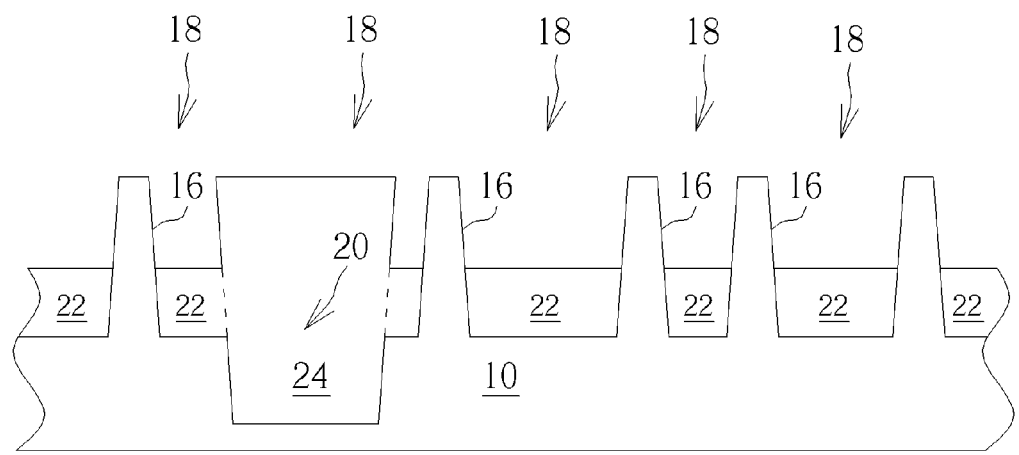

Please refer to FIGS. 1A-3B, which are schematic drawings illustrating a method for manufacturing isolation structures provided by a preferred embodiment of the present invention. FIGS. 1B, 2B, and 3B respectively are cross-sectional view taken along Line A-A' of FIGS. 1A, 2A, and 3A. It is noteworthy that the method for manufacturing isolation structures provided by the preferred embodiment adopts an approach for manufacturing fin structures for multi-gate transistor device, namely, the spacer image transfer (SIT) approach. Therefore the isolation structures can be integrated with the fin structures for multi-gate transistor device according to the preferred embodiment. As shown in FIG. 1A and FIG. 1B, a substrate 10 is provided. The substrate 10 includes at least a silicon material layer. A pad layer (not shown) can be formed on a surface of the substrate 10 if required, and the pad layer can include oxides, nitride, or any other suitable materials. Next, a mandrel layer 12a, 12b, and 12c are formed on the substrate 10 and/or the pad layer. It is noteworthy that a width of the mandrel layer 12a, 12b, 12c can be different depending on different process or product requirements. For instance, the mandrel layer 12a includes a width $W_A$, the mandrel layer 12b includes a width $W_B$, and the mandrel layer 12c includes a width $W_C$, and the width $W_A$, the width $W_B$ and the width $W_C$ are different from each other in the preferred embodiment. Additionally, the mandrel layer 12a, 12b, 12c can include an identical or different shapes. Furthermore, a spacing distance $D_1$ between the mandrel layer 12a and the mandrel layer 12b can be different from a spacing distance $D_2$ between the mandrel layer 12b and the mandrel layer 12c as mentioned in the preferred embodiment, but the spacing distance $D_1$ and $D_2$ can be the same if required. Then, a spacer layer 14 is respectively formed on sidewalls of the mandrel layers 12a, 12b, and 12c. According to the preferred embodiment, widths of the spacer layers 14 are all the same. However, it is well-known to those skilled in the art that the spacer layers 14a of different widths can be formed if required.

Please refer to FIGS. 2A and 2B. Next, the mandrel layers 12a, 12b, and 12c are removed and followed by an etching process with the spacer layers 14 serving as an etching mask. Accordingly, the substrate 10 is etched and thus a plurality of fin structures 16 are formed. Those fin structures 16 are spaced apart from each other by a plurality of first trenches 18. It is well-known to those skilled in the art that portions of the fin structures 16 serve as locations where the source/drain for the multi-gate transistor device are to be formed, another portions of the fin structures 16 serve as the dummy fin structures for mitigating micro-loading effect.

Please refer to FIGS. 3A and 3B. It is noteworthy that the preferred embodiment adopts not only the SIT approach, but also a dual shallow trench isolation (dual STI) approach. Accordingly, unnecessary spacer layers 14 are removed after forming the first trenches 18 by etching the substrate 10, and followed by etching portions of the first trenches 18. Consequently, at least a second trench 20 is formed in the bottom of the first trench 18. Then, the first trenches 18 and the second trench 20 are filled up with an insulating material and an etching back process is subsequently performed to recess top surface of the insulating material and thus a plurality of first isolation structures 22 and at least a second isolation structure 24 are formed. In this approach, a top surface of the first isolation structures 22 and a top surface of the second isolation structure 24 are coplanar (shown in FIGS. 5 and 6) while in the substrate-thickness direction, a depth of the first isolation structures 22 is different from a depth of the second isolation structure 24. Additionally, in another approach provided by the preferred embodiment, the insulating material filling up the first trenches 18 and the second trench 20 is recessed only in certain regions. Therefore, a top surface of the first isolation structures 22 in the same region and a top surface of the second isolation structure 24 in the same region are coplanar (shown in FIG. 9), but top surfaces of the first isolation structures 22 in different regions are non-coplanar and/or top surfaces of the second isolation structures 24 in different regions are non-coplanar (shown in FIG. 10).

Avert to another approach provided by the preferred embodiment, the first trenches 18 are filled up with an insulating material and followed by an etching back process, and thus a top surface of the insulating material in the first trenches 18 is lower than a top surface of the fin structures 16. Then, a protecting layer is formed on the insulating material and another etching process is subsequently performed to etch portions of the spacer layers 14 and the first trench 18 not protected by the protecting layer. Therefore, a deeper second trench 20 is formed in the first trench 18. Next, another insulating layer is provided to fill up the second trench 20. The protecting layer is then removed, and the first isolation structures 22 and the second isolation structure 24 as shown in FIG. 3 are obtained. As shown in FIG. 3, a depth of the first isolation structures 22 is different from a depth of the second isolation structure 24, and top surfaces of the first isolation structures 22 and a top of the second isolation structure 24 are non-coplanar. However, it should be easily realized by those skilled in the art that steps for forming the first isolation structures 22 and the second isolation structures 24 are never limited to the abovementioned approaches, and top surfaces of the isolation structures 22/24 in different regions or in the same regions can be coplanar or non-coplanar depending on different product of process requirements.

It is noteworthy that the depth of the second isolation structures 24 is sufficient to provide effective electrical isolation between devices or between active regions. The first isolation structures 22 are able to provide electrical isolation between the fin structures of a multi-gate transistor device. It is noteworthy that the depth of the first isolation structures 22 is smaller than the depth of the second isolation structure 24 as shown in FIG. 3, therefore degrees-of-freedom of the production process is improved. It is well-known to those skilled in the art that improved degrees-of-freedom of the production process means process window is improved. Accordingly, the present invention provides a method for manufacturing isolation structures adopting both the SIT approach and the dual STI approach, therefore the fin structures 16, the first isolation structures 22, and the second isolation structures 24 are provided with the first isolation structures 22 and the second isolation structures 24, which include different depths, are able to render different electrical isolation required by different devices/structures. Briefly speaking, the degrees-of-freedom of the production process and design flexibility are all improved.

Figure 4:
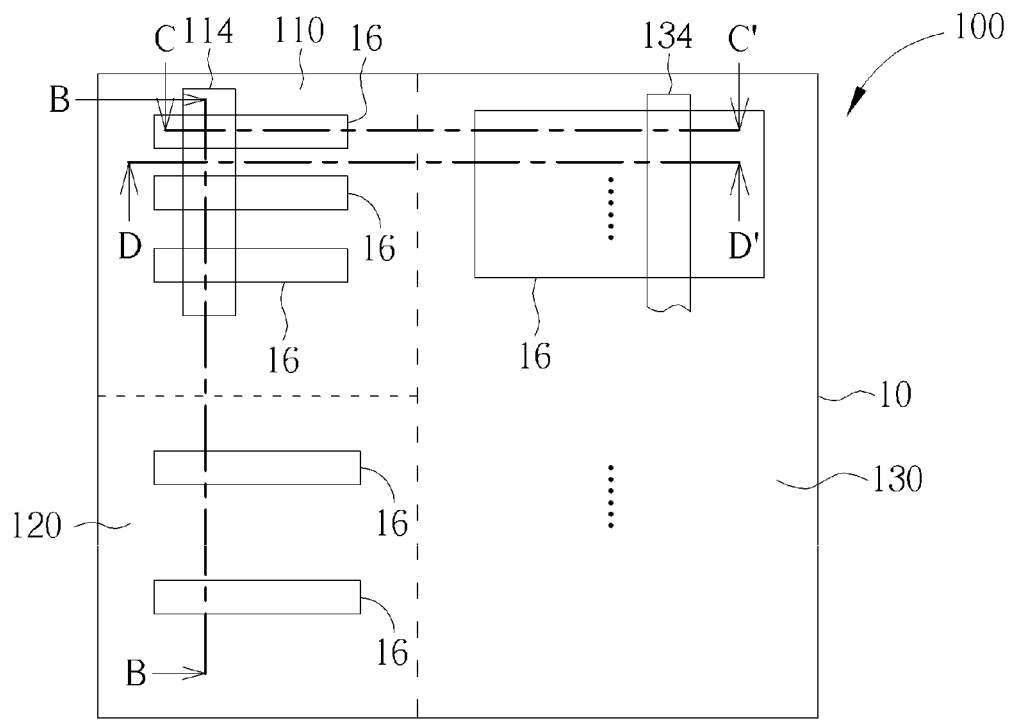
FIG. 4 is a plane view of a semiconductor integrated circuit provided by a preferred embodiment of the present invention.

Please refer to FIG. 4, which is a plane view of a semiconductor integrated circuit provided by a preferred embodiment of the present invention. As shown in FIG. 4, the semiconductor integrated circuit 100 provided by the preferred embodiment is formed on substrate 10, and the substrate 10 includes a multi-gate transistor device region 110, an n-well resistor region 120, and a LDMOS device region 130 defined thereon. It is noted that for clarifying the spatial relationships between the fin structures and the gate structures in the multi-gate transistor device region 110, the n-well resistor region 120, and the LDMOS device region 130, only the fin structures and the gate structures are shown in FIG. 4, while the other elements are omitted. However, those skilled in the art would easily realize that the spatial relationships between the omitted elements and the fin structures according to the following description and figures. Furthermore, it should be understood that the spatial relationship and sizes of the multi-gate transistor device region 110, the n-well resistor region 120, and the LDMOS device region 130 are only exemplarily provided. Those skilled in the art would easily realize that the sizes and the arrangements of the multi-gate transistor device region 110, the n-well resistor region 120, and the LDMOS device region 130 shown in FIG. 4 are not limited thereto. In the same concept, the amounts and arrangements of the fin structures located in the multi-gate transistor device region 110, the n-well resistor region 120, and the LDMOS device region 130 are only exemplarily disclosed and not limited to this.

Figure 5:
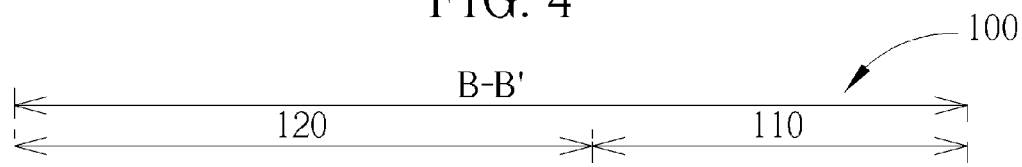
FIG. 5 is a cross-sectional view taken along a Line B-B' of FIG. 4.
Figure 5:
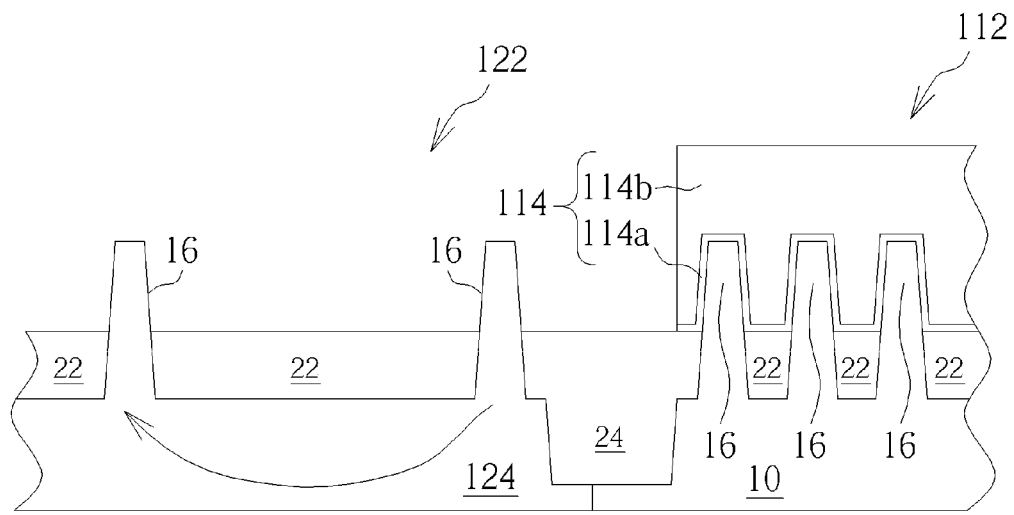

Please refer to FIG. 4 and FIG. 5, wherein FIG. 5 is a cross-sectional view taken along a Line B-B' of FIG. 4. As shown in FIG. 4 and FIG. 5, the integrated circuit 100 provided by the preferred embodiment includes at least a multi-gate transistor device 112 positioned in the multi-gate transistor device region 110 and at least an n-well resistor 122 positioned in the n-well resistor region 120. The multi-gate transistor device 112 and the n-well resistor 122 are electrically isolated from each other by one second isolation structure 24. As mentioned above, since the depth of the second isolation structure 24 is deep enough, the second isolation structures 24 renders effective electrical isolation between the two devices and avoids unwanted electrical contact between the two devices.

As shown in FIG. 4 and FIG. 5, the multi-gate transistor device 112 includes a plurality of fin structures 16. The fin structures 16 are parallel with each other and spaced apart from each other by the first isolation structures 22. As mentioned above, since the depth of the first isolation structures 22 is smaller than the depth of the second isolation structure 24, the degrees-of-freedom of the fin fabrication process is improved. The multi-gate transistor device 112 further includes a gate electrode 114 positioned on the substrate 10, and intersectionally arranged with the fin structures 16. The electrode 114 covers a portion of each fin structure 16, as shown in FIG. 4 and FIG. 5. The gate electrode 114 includes a gate dielectric layer 114a and a gate conductive layer 114b. The gate dielectric layer 114a includes the conventional dielectric material such as silicon oxide (SiO), silicon nitride (SiN), or silicon oxynitride (SiON). In the preferred embodiment, the gate dielectric layer 114a can further include high-K dielectric material such as hafnium oxide (HfO), hafnium silicate (HfSiO), or metal oxide or metal silicate exemplarily of aluminum (Al), zirconium (Zr), lanthanum (La), but not limited to this. In addition, when the gate dielectric layer 114a of the preferred embodiment adopts the high-K dielectric material, the present invention can be further integrated with the metal gate process. Therefore a control gate compatible to the high-K gate dielectric layer is obtained.

A source/drain extension region 116a (shown in FIG. 8) can be formed in the fin structures 16 of the multi-gate transistor device 112, a spacer 118 (shown in FIG. 8) can be subsequently formed on sidewalls of the gate electrode 114, and a source/drain 116b (shown in FIG. 8) can be subsequently formed in the fin structures 16 at respective two sides of the gate electrode 114. Additionally, a selective epitaxial growth (SEG) process can be performed to form an epitaxial layer (not shown) on the fin structures 116 at respective two sides of the gate electrode 114. Since the elements such as the gate dielectric layer 114a, the gate conductive layer 114b, the source/drain extension regions 116a, the spacer 118, and the epitaxial source/drain 116b are well known to those skilled in the art, those details are omitted in the interest of brevity.

Please still refer to FIG. 4 and FIG. 5. The n-well resistor 122 of the semiconductor integrated circuit 100 provided by the preferred embodiment includes an n-well 124 and at least a pair of fin structures 16. The two fin structures 16 serve as two terminals for the n-well resistor 122. More important, the n-well resistor 122 includes at least one first isolation structure 22 with the two fin structures 16 positioned at respective two ends of the first isolation structure 22 as shown in FIG. 5. Therefore, current passing from one terminal toward another terminal is forced to travel through the n-well region 124 under the first isolation structure 22 as illustrated by the solid-line arrow shown in FIG. 5. It is noteworthy that though the first isolation structure 22 in the n-well resistor 122 and the first isolation structures 22 in the multi-gate transistor device 112 share the identical depth, an area of the first isolation structure 22 in the n-well resistor 122 is preferably larger than an area of the first isolation structures 22 in the multi-gate transistor device 112. The larger area of the first isolation structure 22 in the n-well resistor 122 provides longer current path and thus improves the electrical performance of the n-well resistor 122.

Figure 6:
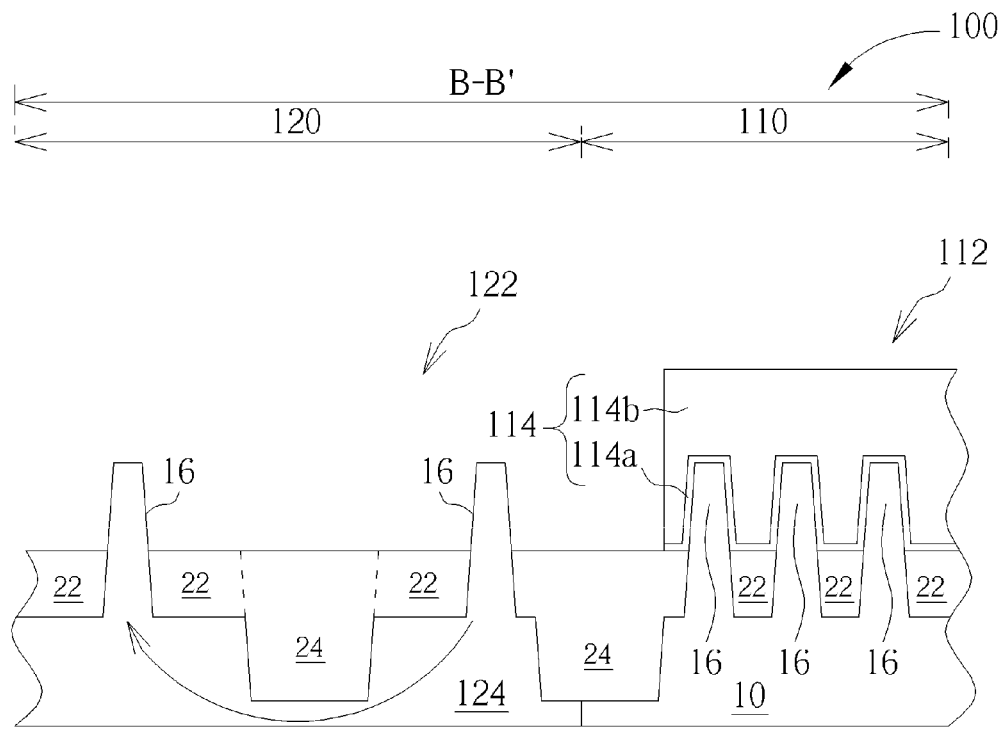
FIG. 6 is a cross-sectional view of a modification to the semiconductor integrated circuit provided by the present invention.

Please refer to FIG. 6, which is a cross-sectional view of a modification to the semiconductor integrated circuit provided by the present invention. It should be noted that a plane view of the instant modification is identical to the plane view shown in FIG. 4, therefore FIG. 4 and FIG. 6 should be referred together. Furthermore, elements the same in the both of the modification and the aforementioned embodiment are designated by the same numerals. The difference between the modification and the aforementioned embodiment is: the n-well resistor 122 further includes at least one second isolation structure 24, and the first isolation structure 22 and the second isolation structure 24 of the n-well resistor 122 are coplanar as shown in FIG. 6. As mentioned above, the depth of the second isolation structure 24 is larger than the depth of the first isolation structure 22, therefore an even longer current path is obtained as shown FIG. 6. Consequently, resistance of the n-well resistor 122 is further increased.

Figure 7:
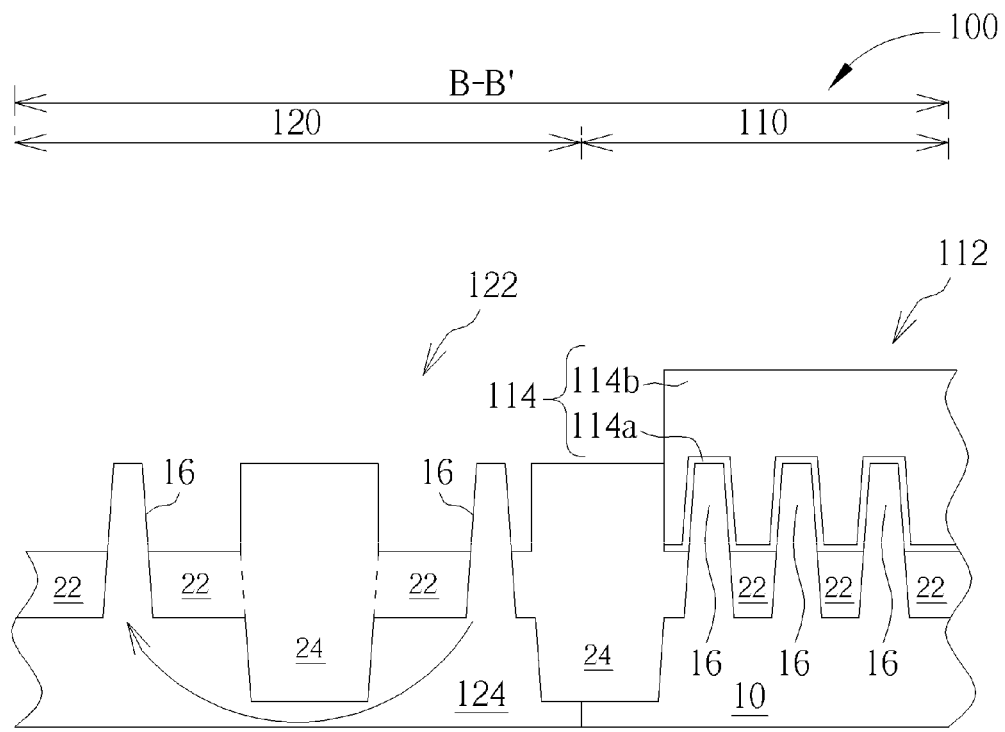
FIG. 7 is a cross-sectional view of another modification to the semiconductor integrated circuit provided by the present invention.

Please refer to FIG. 7, which is a cross-sectional view of another modification to the semiconductor integrated circuit provided by the present invention. It should be noted that a plane view of the instant modification is identical to the plane view shown in FIG. 4, therefore FIG. 4 and FIG. 7 should be referred together. Furthermore, elements the same in the both of the modification and the aforementioned embodiment are designated by the same numerals. The difference between the modification and the aforementioned embodiment is: the n-well resistor 122 further includes at least one second isolation structure 24, and the first isolation structures 22 and the second isolation structure 24 of the n-well resistor 122 are non-coplanar. As shown in FIG. 7, a top surface of the second isolation structure 24 is higher than a top surface of the first isolation structure 22. On the other hand, the depth of the second isolation structure 24 is still larger than the depth of the first isolation structure 22, therefore a longer current path is obtained as shown FIG. 7. Consequently, resistance of the n-well resistor 122 is further increased.

Figure 8:
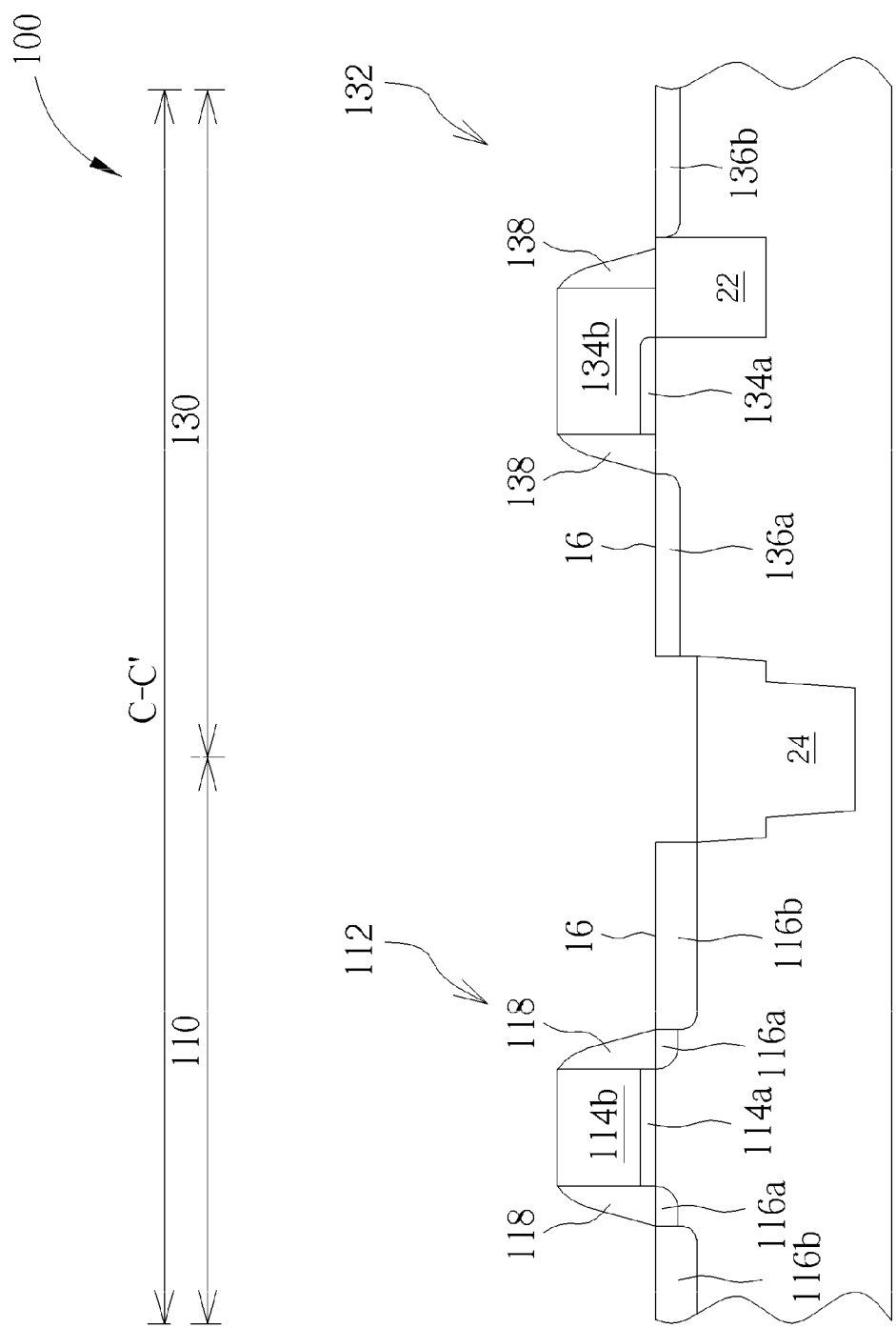
FIG. 8 is a cross-sectional view taken along a Line C-C' of FIG. 4.
Figure 9:
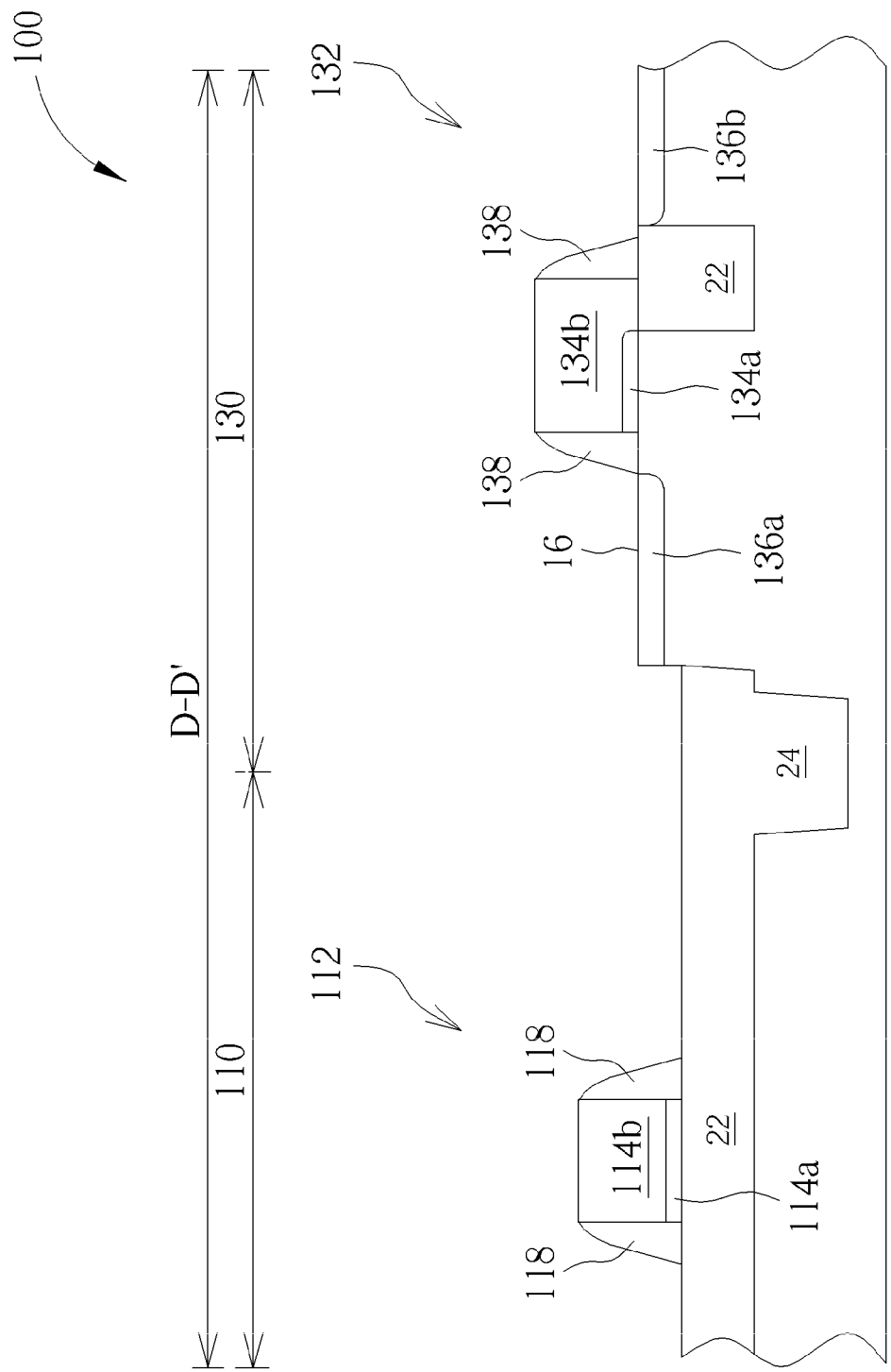
FIG. 9 is a cross-sectional view taken along a Line D-D' of FIG. 4.

Please refer to FIG. 4 and FIGS. 8-9, wherein FIG. 8 is a cross-sectional view taken along a Line C-C' of FIG. 4 and FIG. 9 is a cross-sectional view taken along a Line D-D' of FIG. 4. As shown in FIG. 4 and FIG. 8, the semiconductor integrated circuit 100 provided by the preferred embodiment includes at least the multi-gate transistor device 112 positioned in the multi-gate transistor device region 110 and at least a LDMOS device 132 positioned in the LDMOS device region 130. The multi-gate transistor device 112 and the LDMOS device 132 are electrically isolated from each other by one second isolation structure 24. As mentioned above, since the depth of the second isolation structure 24 is deep enough, the second isolation structure 24 renders effective electrical isolation between the two devices and avoids unwanted electrical contact between the two devices.

As mentioned above, the multi-gate transistor device 112 includes the plurality of fin structures 16. The fin structures 16 are parallel with each other and spaced apart from each other by the first isolation structures 22. As mentioned above, since the depth of the first isolation structures 22 is smaller than the depth of the second isolation structure 24, the degrees-of-freedom of the fin fabrication process is improved. The multi-gate transistor device 112 further includes a gate electrode 114 positioned on the substrate 10, and intersectionally arranged with the fin structures 16. The electrode 114 covers a portion of each fin structure 16 as shown in FIG. 8. The gate electrode 114 includes a gate dielectric layer 114a and a gate conductive layer 114b. A source/drain extension region 116a can be formed in the fin structures 16 of the multi-gate transistor device 112, a spacer 118 can be subsequently formed on sidewalls of the gate electrode 114, and a source/drain 116b can be subsequently formed in the fin structures 16 at respective two sides of the gate electrode 114.

Please still refer to FIG. 4 and FIGS. 8-9. The LDMOS device 132 provided by the preferred embodiment includes a gate electrode 134 and at least one fin structure 16. The gate electrode 134 is intersectionally arranged with the fin structure 16. As shown in FIGS. 8-9, the gate electrode 134 covers a portion of the fin structure 16. Furthermore, the gate electrode 134 includes a gate dielectric layer 134a and a gate conductive layer 134b. A spacer 138 is formed at sidewalls of the gate electrode 134. As mentioned above, during performing the SIT process, the shapes and the widths of the fin structures 16 can be adjusted to comply different product requirements. Therefore, the width of the fin structure 16 in the LDMOS device 132 can be larger than the width of the fin structures 16 in the multi-gate transistor device 112, but not limited to this. It should be easily realized by those skilled in the art that the shapes, the amounts, and the widths of the fin structures 16 in the LDMOS device 132 and in the multi-gate transistor device 112 can be the same if required.

Please refer to FIGS. 1-3 again and simultaneously refer to FIGS. 8-9. According to the preferred embodiment, after forming the first trenches 22, an insulating material can be provided to fill up the first trench 22 and then etched back. It is noteworthy that a protecting layer (not shown) can be formed in the LDMOS region 130 and thus a top surface of the insulating material in the first trench 22 in the LDMOS device region 130 is not lowered while the top surface of the insulating material in other region is lowered. Meanwhile, the first isolation structure 22 in the LDMOS region 130 is obtained as shown in FIGS. 3 and 8. Then, steps for forming the second trench and filling the second trench with an insulating material are subsequently performed, and thus the first isolation structures 22 in the other regions and the second isolation structure 24 are obtained as shown in FIGS. 3 and 9. Accordingly, though the first isolation structures 22 in the LDMOS device region 130 and the first isolation structures 22 in the other regions share the identical depth, a top surface of the first isolation structure 22 in the LDMOS device region 130 and the top surface of the first isolation structures 22 in the other regions are non-coplanar as shown in FIGS. 8-9. In addition, the first isolation structure 22 in the LDMOS device region 130 is taken as encompassed by and formed in the fin structure 16.

Please refer to FIGS. 8-9 again. In the preferred embodiment, the gate electrode 134 covers a portion of the first isolation structure 22. The LDMOS device 132 includes a source region 136a and a drain region 136b. Furthermore, the first isolation structure 22 is not only encompassed by the fin structures 16, but also formed in the fin structure 16 near the drain region 136b. Additionally, other elements such as body region or n-drift region, which are required by HV device, can be formed in the fin structure 16 of the LDMOS device 132. Since the aforementioned elements are well known to those skilled in the art, those details are omitted in the interest of brevity.

Figure 10:
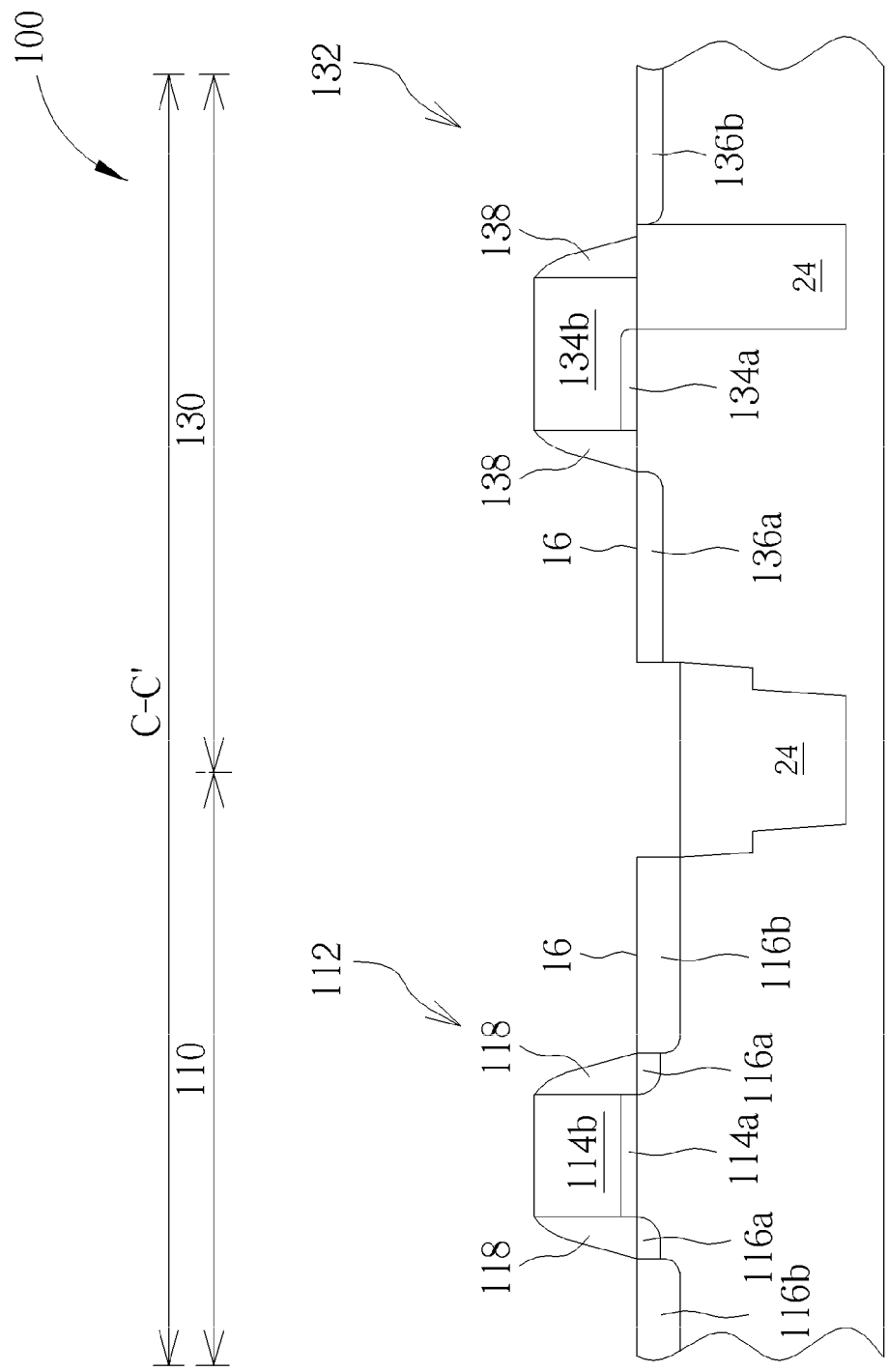
FIG. 10 is another modification to the semiconductor integrated circuit provided by the present invention.

Please refer to FIG. 10, which is another modification to the semiconductor integrated circuit provided by the present invention. It should be noted that a plane view of the instant modification is identical to the plane view shown in FIG. 4, therefore FIG. 4 and FIG. 10 should be referred together. Furthermore, elements the same in the both of the modification and the aforementioned embodiment are designated by the same numerals. The difference between the modification and the aforementioned embodiment is: The LDMOS device 132 of the modification includes one second isolation structure 24. As mentioned above, since the depth of the second isolation structure 24 is larger than the depth of the first isolation structures 22, a longer current path is obtained when the high-voltage current passing the second isolation structure 24. Consequently, voltage endurance capability of the LDMOS device 132 is further improved.

According to the semiconductor integrated circuit provided by the present invention, the multi-gate transistor device having the fin structures is integrated with the n-well resistor and/or the LDMOS device, which complies with high voltage requirement. Those different devices are electrically isolated by the first isolation structures and the second isolation structures of which the sizes are different. In other words, the semiconductor integrated circuit provided by the present invention renders superior flexibility to those circuit designers. In other words, the semiconductor integrated circuit having devices of different sized can be integrated without increasing process cost due to the flexibility rendered by the semiconductor integrated circuit of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor integrated circuit comprising:
   a substrate having a plurality of first isolation structures and at least a second isolation structure formed therein, and a depth of the first isolation structures being smaller than a depth of the second isolation structure;
   a multi-gate transistor device formed on the substrate, the multi-gate transistor device comprising a plurality of fin structures, and the fin structures being parallel with each other and spaced apart from each other by the first isolation structures; and
   an n-well resistor formed in the substrate, the n-well resistor comprising at least one first isolation structure and two fin terminals positioned at respective two ends of the first isolation structure, and the n-well resistor being electrically isolated from the multi-gate transistor device by the second isolation structure.

2. The semiconductor integrated circuit according to claim 1, wherein the multi-gate transistor device further comprises a gate electrode positioned on the substrate and intersectionally arranged with the fin structures, and the gate electrode covers a portion of each fin structure.

3. The semiconductor integrated circuit according to claim 1, wherein an area of the first isolation structure in the n-well resistor is larger than an area of the first isolation structures in the multi-gate transistor device.

4. The semiconductor integrated circuit according to claim 1, wherein the n-well resistor further comprises at least one second isolation structure.

5. The semiconductor integrated circuit according to claim 4, wherein the two fin terminals are positioned at respective two ends of the second isolation structure.

6. The semiconductor integrated circuit according to claim 4, wherein the first isolation structure and the second isolation structure positioned in the n-well resistor have co-planar top surfaces.

7. The semiconductor integrated circuit according to claim 4, wherein a top surface of the second isolation structure in the n-well resistor is higher than a top surface of the first isolation structure in the n-well resistor.

\* \* \* \* \*